US007295068B2

(12) United States Patent
Capofreddi et al.

(10) Patent No.: US 7,295,068 B2
(45) Date of Patent: Nov. 13, 2007

(54) INCREASING THE LINEARITY OF A TRANSCONDUCTANCE CELL

(75) Inventors: Peter Capofreddi, San Francisco, CA (US); Arvin Ramesh Shahani, Menlo Park, CA (US); Derek Shaeffer, Redwood City, CA (US); Korhan Titizer, Saratoga, CA (US)

(73) Assignee: Beceem Communications Inc., Santa Clara, CA (US)

( * ) Notice: Subject to any disclaimer, the term of this patent is extended or adjusted under 35 U.S.C. 154(b) by 50 days.

(21) Appl. No.: 11/134,684

(22) Filed: May 19, 2005

(65) Prior Publication Data

US 2006/0261894 A1 Nov. 23, 2006

(51) Int. Cl.
*H03F 3/45* (2006.01)

(52) U.S. Cl. ...................................... 330/254; 330/253

(58) Field of Classification Search ................ 330/253, 330/254, 260, 261, 85
See application file for complete search history.

(56) References Cited

U.S. PATENT DOCUMENTS 6,865,382 B2 * 3/2005 Behzad ....................... 455/323
6,891,435 B2 * 5/2005 Patel et al. ................. 330/254

* cited by examiner

*Primary Examiner*—Henry Choe

(57) ABSTRACT

A transconductance cell is disclosed that includes a first transistor and a second transistor. A regulator regulates an average voltage in response to a reference voltage, where the average voltage corresponds to the average of a voltage at a bias terminal of the first transistor and a voltage at a bias terminal of the second transistor. A mixer including the transconductance cell is also disclosed. In the mixer, the transconductance cell receives a differential input voltage and produces a differential output current. The mixer also includes one or more switches that multiply the differential output current with an oscillator signal. A method is disclosed that includes measuring an average voltage of a voltage at a bias terminal of a first transistor and a voltage at a bias terminal of a second transistor and regulating the average voltage responsive to the measured average voltage and a reference voltage.

30 Claims, 4 Drawing Sheets

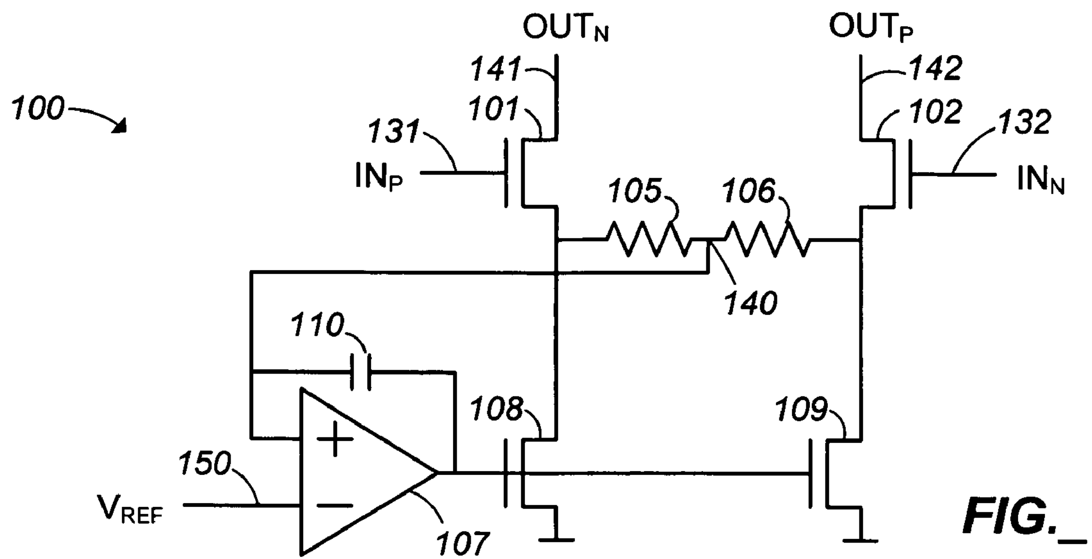
FIG._1
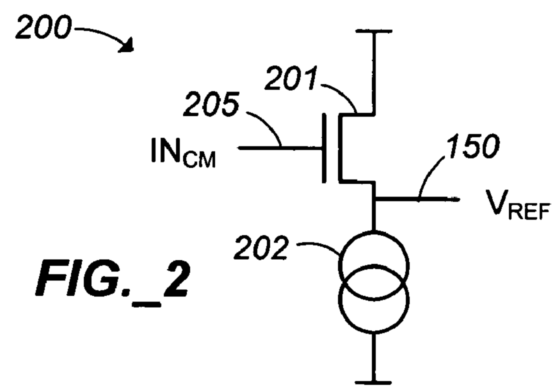
FIG._2
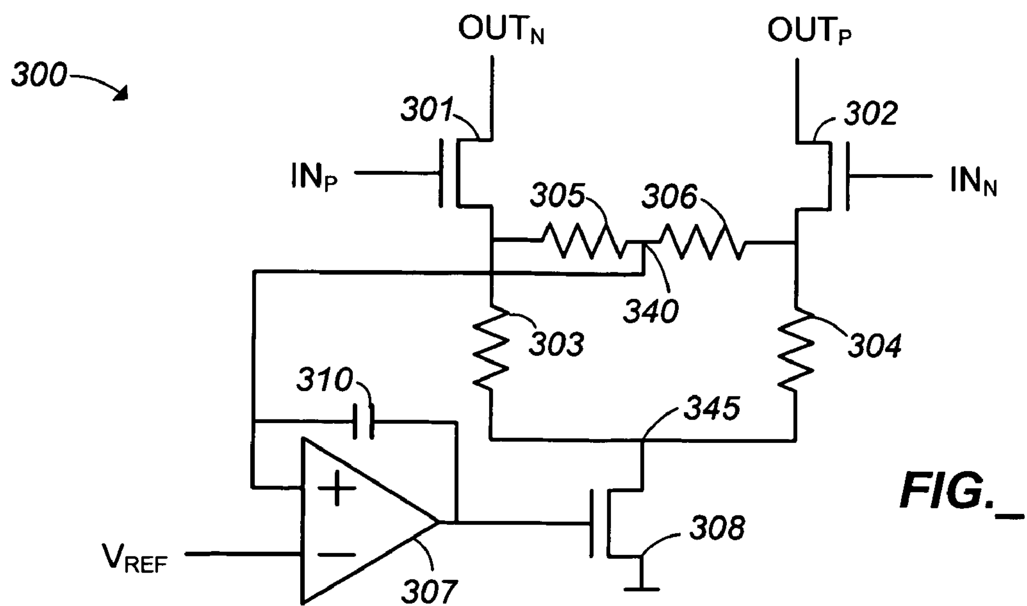
FIG._3

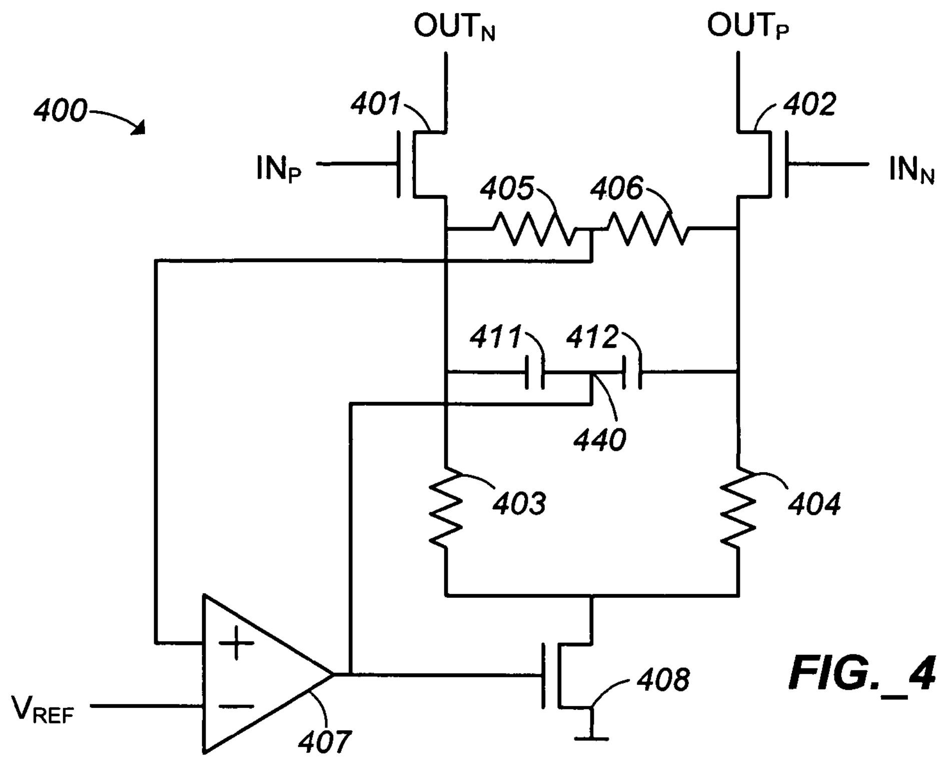
FIG._4
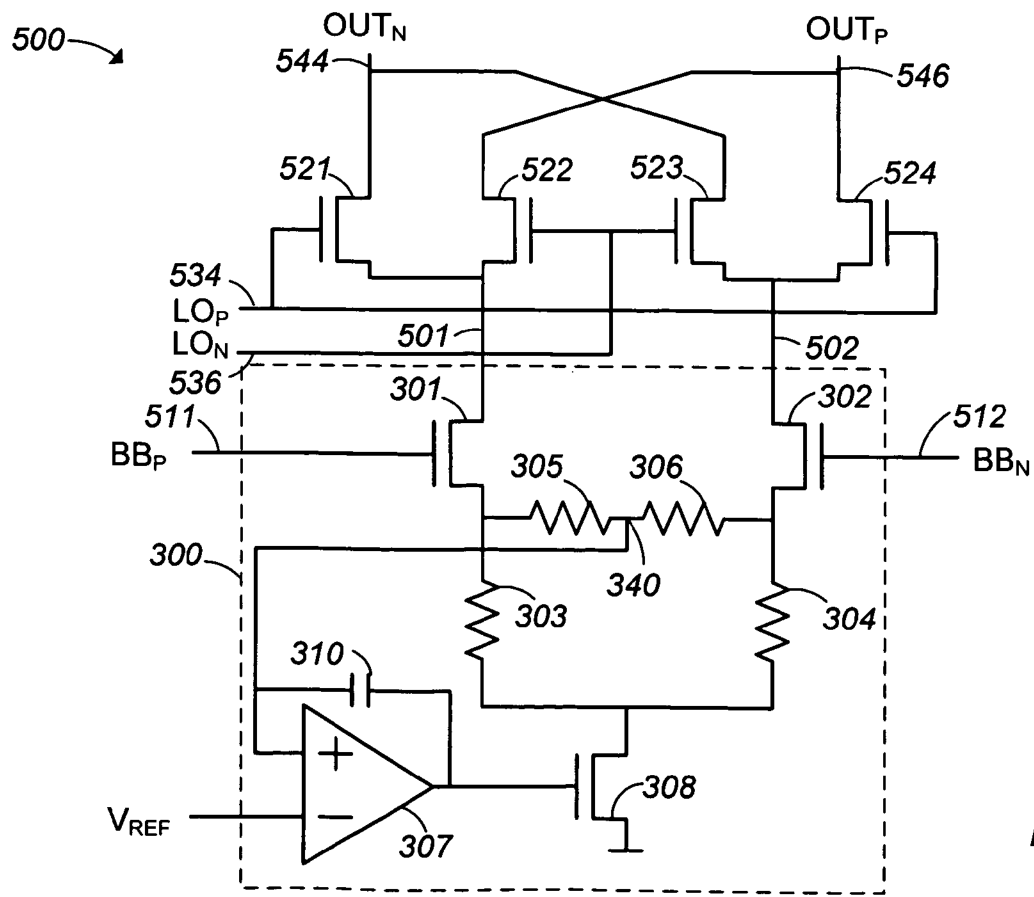
FIG._5

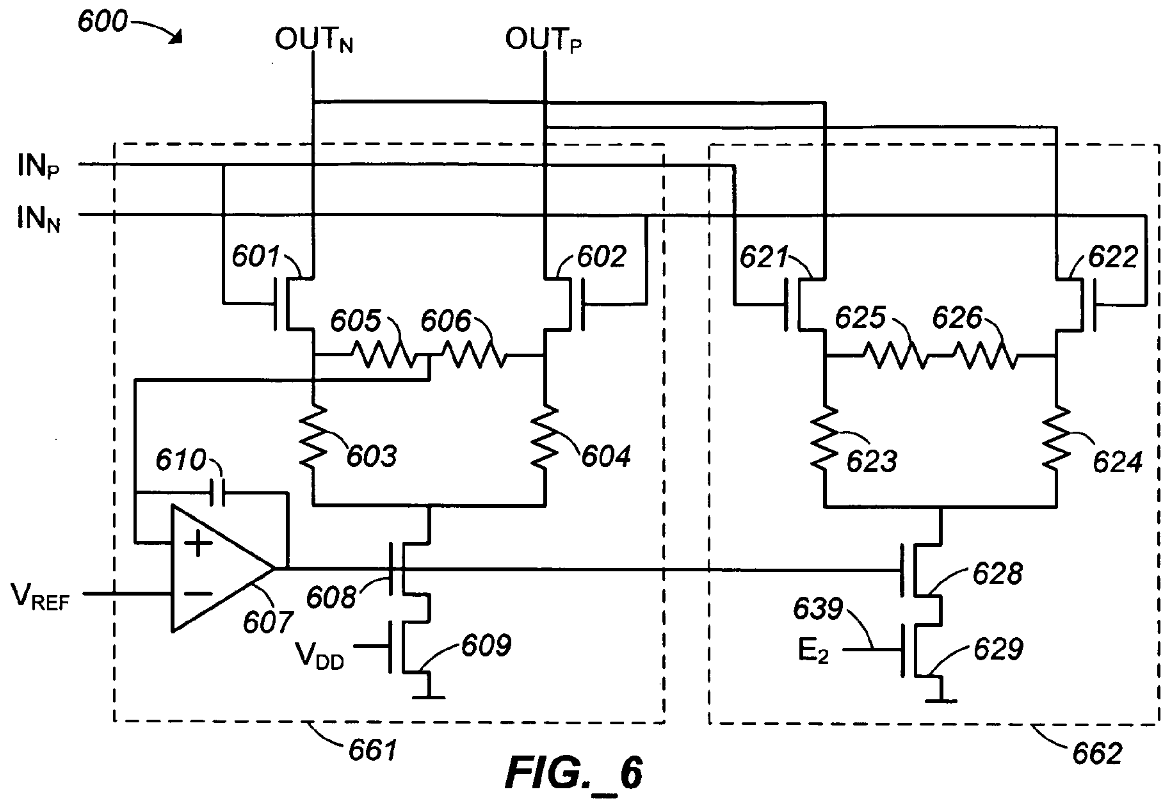
FIG._6
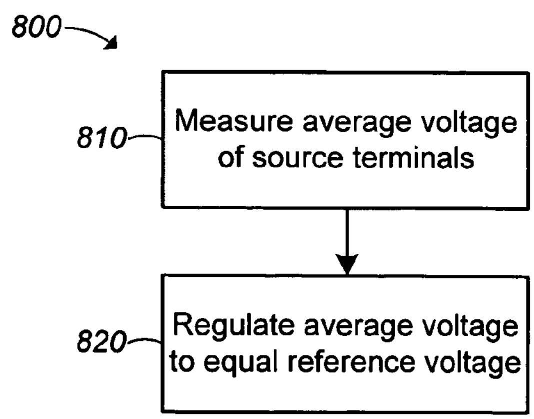
FIG._8

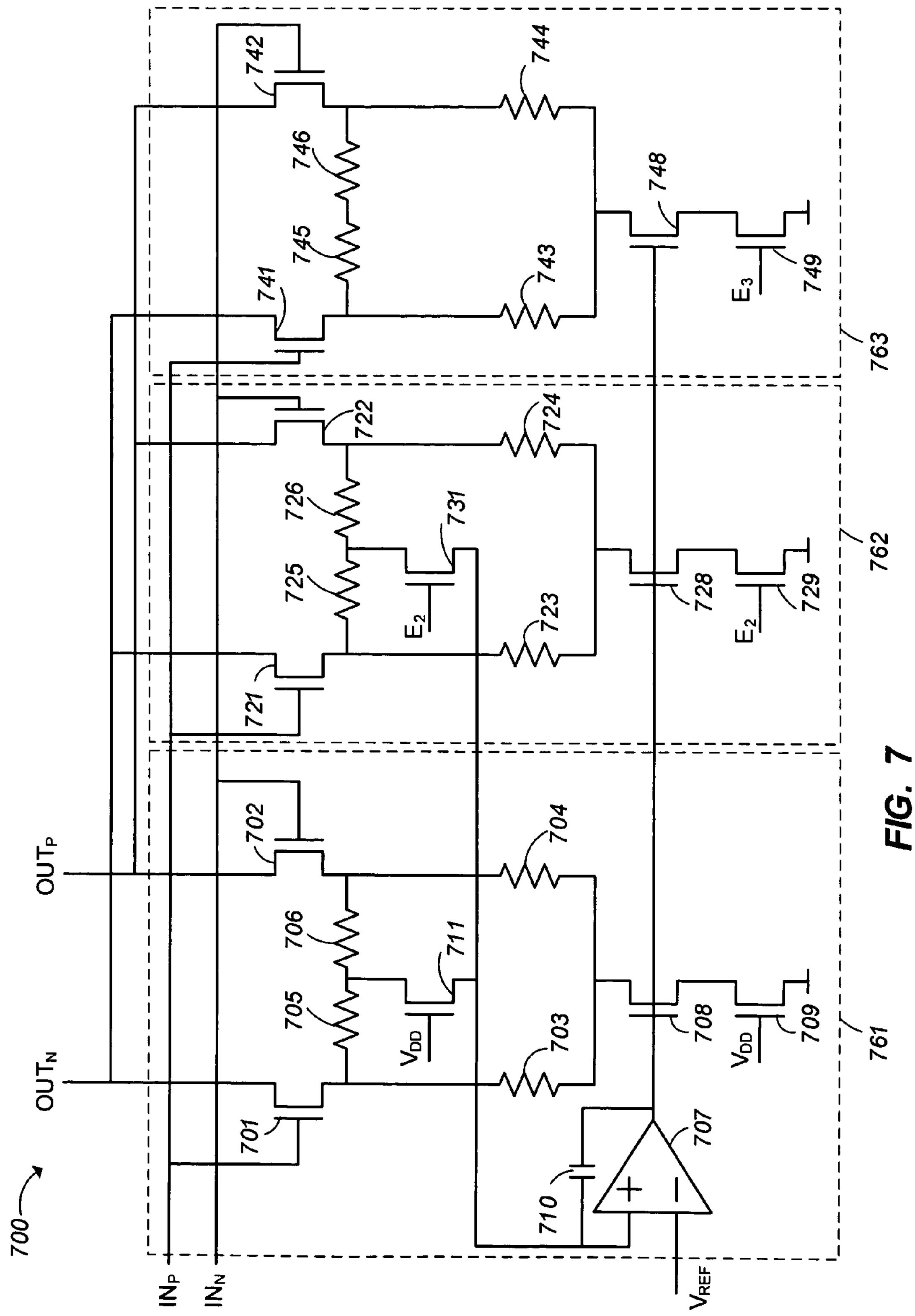
FIG._7

INCREASING THE LINEARITY OF A TRANSCONDUCTANCE CELL

BACKGROUND

The following disclosure relates to electrical circuits and signal processing.

A conventional resistively-degenerated common source transconductance cell typically is designed to be differential and symmetric in order to avoid significant second-order distortion. However, significant third-order distortion typically is produced. Third-order distortion typically is produced in a conventional resistively-degenerated common source transconductance cell even if the current/voltage characteristic of the transistors in the transconductance cell follows ideal square-law behavior.

SUMMARY

In one aspect, a transconductance cell is provided that includes a first transistor and a second transistor. The first transistor includes a first input terminal, a first output terminal, and a first bias terminal, and the second transistor includes a second input terminal, a second output terminal, and a second bias terminal. The transconductance cell also includes a regulator that regulates a first average voltage responsive to a reference voltage, where the first average voltage corresponds to the average of a voltage at the first bias terminal and a voltage at the second bias terminal.

Particular implementations may include one or more of the following features. The transconductance cell includes a degeneration circuit that degenerates the first and second transistors. A voltage divider measures the first average voltage and provides the measured first average voltage to the regulator, and the regulator regulates the first average voltage responsive to the reference voltage and the measured first average voltage. The regulator includes an operational amplifier that receives the measured first average voltage and the reference voltage and to controls a bias current through the first and second transistors, a bias voltage in the transconductance cell, or both. The transconductance cell includes one or more capacitors that improve a phase margin of a feedback loop that includes the operational amplifier. The first and second transistors are either field effect transistors or bipolar junction transistors.

The regulator includes an operational amplifier that receives the voltage at the first bias terminal, the voltage at the second bias terminal, and the reference voltage and controls a bias current through the first and second transistors, a bias voltage in the transconductance cell, or both. The transconductance cell includes a first subcell and a second subcell, where the first subcell includes the first and second transistors, the second subcell includes a third transistor and a fourth transistor, and the regulator controls a first bias current through the first and second transistors and a second bias current through the third and fourth transistors responsive to the reference voltage and a measurement of the first average voltage. The transconductance cell includes a first subcell and a second subcell, where the first subcell includes the first and second transistors, and the second subcell includes a third transistor and a fourth transistor. The third transistor includes a third bias terminal, and the fourth transistor includes a fourth bias terminal. The regulator regulates the first average voltage and a second average voltage responsive to the reference voltage, a measurement of the first average voltage, and a measurement of the second average voltage, where the second average voltage corresponds to the average of a voltage at the third bias terminal and a voltage at the fourth bias terminal.

In another aspect, a mixer is provided that includes the transconductance cell and one or more switches. The transconductance cell receives a differential input voltage and produces a differential output current. The one or more switches multiply the differential output current with an oscillator signal.

In yet another aspect, a method is provided that includes measuring an average voltage of a voltage at a first bias terminal of a first transistor and a voltage at a second bias terminal of a second transistor. The average voltage is regulated responsive to the measured average voltage and a reference voltage.

Particular implementations may include one or more of the following features. The first and second transistors are degenerated. Regulating the average voltage includes controlling a bias current through the first and second transistors, a bias voltage, or both. Regulating the average voltage includes controlling a first bias current through the first and second transistors and a second bias current through a third transistor and a fourth transistor responsive to the measured average voltage and the reference voltage. A second average voltage of a voltage at a third bias terminal of a third transistor and a voltage at a fourth bias terminal of a fourth transistor is measured. Regulating the average voltage includes regulating the average voltage and the second average voltage responsive to the measured average voltage, the reference voltage, and the second measured average voltage.

The methods, apparatus, and systems described herein can be implemented to realize one or more of the following advantages. Third-order and higher-order distortion in a transconductance cell is reduced without adding significant noise to the output of the transconductor. Distortion is reduced in a power-efficient manner. Distortion is reduced while preserving the full bandwidth of the transconductor.

These general and specific aspects may be implemented using a method, an apparatus, a system, or any combination of methods, apparatus, and systems.

The details of one or more implementations are set forth in the accompanying drawings and the description below. Other features and advantages will become apparent from the description, the drawings, and the claims.

BRIEF DESCRIPTION OF THE DRAWINGS

FIG. 1 is a schematic of a transconductance cell.

FIG. 2 is a schematic of a circuit for generating a reference voltage.

FIGS. 3-4 are schematics of transconductance cells.

FIG. 5 is a schematic of a mixer.

FIG. 6 is a schematic of a transconductance cell that includes two subcells.

FIG. 7 is a schematic of a transconductance cell that includes three subcells.

FIG. 8 is a flowchart of a process for improving the linearity of a transconductance cell.

Like reference numbers and designations in the various drawings indicate like elements.

DETAILED DESCRIPTION

As shown in FIG. 1, a transconductance cell 100 includes transistors 101 and 102. The series combination of resistors 105 and 106 forms a degeneration resistor and functions as a voltage divider, generating a voltage at a node 140 that is the average of the voltages at the sources of transistors 101 and 102. The voltage at node 140 is provided to a regulator (e.g., operational amplifier 107) that compares the voltage at node 140 to a reference voltage ($V_{REF}$) 150. The output of operational amplifier 107 is connected to the gates of current source transistors 108 and 109. The current that biases transistors 101 and 102 can be adjusted by adjusting the voltage at the output of operational amplifier 107. Node 140, operational amplifier 107, and current source transistors 108 and 109 form a feedback loop that regulates the voltage at node 140, keeping the voltage at a substantially constant level. In transconductance cell 100, operational amplifier 107 explicitly regulates the average of the voltages at the sources of transistors 101 and 102. In one implementation, a different function of the voltages at the sources of transistors 101 and 102 (e.g., a sum or a scaled sum) is explicitly regulated, which typically will also have the effect of regulating the average of the voltages at the sources of transistors 101 and 102. A compensation capacitor 110 improves a phase margin of the feedback loop formed by node 140, operational amplifier 107, and current source transistors 108 and 109.

Transconductance cell 100 receives input voltages 131 and 132 and produces output currents 141 and 142. Assuming that operational amplifier 107 has a gain of A and current source transistor 108 has a transconductance $g_{m108}$, the voltage-to-current DC transfer function of transconductance cell 100 for a small applied signal ΔV is given approximately by:

$$\Delta I = \frac{g_{m0}}{1 + Rg_{m0}/2}\Delta V - \frac{2k^2}{(g_{m0} + Ag_{m108})(1 + Rg_{m0}/2)^4}\Delta V^3$$

where R is the total degeneration resistance: $R=R_{105}+R_{106}$, $g_{m0}$ is the transconductance of each of transistors 101 and 102, and k is the square-law coefficient for each of transistors 101 and 102. The feedback loop including operational amplifier 107 reduces the third-order distortion term in magnitude, compared to a conventional transconductance cell, by a factor of:

$$F=g_{m0}/[g_{m0}+Ag_{m108}].$$

Operational amplifier 107 does not couple significantly into the differential signal path of transconductor 100 (i.e., between input voltages 131-132 and output currents 141-142). Therefore, any noise of operational amplifier 107 does not contribute significantly to any output noise of transconductor 100, and a bias current in operational amplifier 107 can be set at a low level to avoid significant power consumption. In addition, operational amplifier 107 does not limit the bandwidth of transconductor 100 because input voltages 131 and 132 connect directly to the gates of transistors 101 and 102.

FIG. 2 shows a circuit 200 that can be used to generate reference voltage 150 (FIG. 1). A fixed bias current 202 is applied to a transistor 201, and the voltage at the source of transistor 201 can be used as the reference voltage 150. The gate of transistor 201 is tied to a common mode reference voltage 205 ($IN_{CM}$) that corresponds to the common mode voltage of input voltages 131 and 132. Common mode reference voltage 205 can be generated by averaging input voltages 131 and 132 or by using a feedback loop to modify input voltages 131 and 132 such that:

$$IN_{CM}=(IN_N+IN_P)/2.$$

An alternative implementation of a transconductance cell is shown in FIG. 3. In a transconductance cell 300, a single current source transistor 308 is used. Transconductance cell 300 has improved noise performance compared to transconductance cell 100, while preserving the linearizing properties of transconductance cell 100. The improved noise performance occurs because any noise current from a current source transistor 308 appears as a common-mode disturbance and does not strongly couple to the differential mode. A transimpedance of transconductance cell 300 is determined by resistors 303-306. The voltage-to-current DC transfer function of transconductance cell 300 is:

$$\Delta I = \frac{g_{m0}}{1 + Rg_{m0}/2}\Delta V - \frac{2k^2}{(g_{m0} + Ag_{m308})(1 + Rg_{m0}/2)^4}\Delta V^3$$

where $R=(R_{303}+R_{304})(R_{305}+R_{306})/(R_{303}+R_{304}+R_{305}+R_{306})$. In one implementation, resistors 303-306 are replaced by a degeneration circuit including, for example, capacitors, resistors, inductors, and/or active components.

An alternative implementation of a transconductance cell is shown in FIG. 4. Two compensation capacitors 411 and 412 compensate a feedback loop (which includes an operational amplifier 407 and a current source transistor 408) instead of the single compensation capacitor 310 in transconductance cell 300. Using compensation capacitors 411 and 412 has the advantage of removing a pole at node 440 that is present at node 340 of transconductance cell 300. The compensation capacitors 411 and 412 also introduce a zero in a feedforward transfer function of the transconductance cell 400.

FIG. 5 illustrates a mixer 500 that includes transconductance cell 300. Switches 521-524 multiply the output currents 501 and 502 generated by the transconductor cell 300 by local oscillator signals 534 and 536 to produce radio frequency signals 544 and 546.

As shown in FIG. 6, transconductor cell 600 includes subcells 661 and 662. An operational amplifier 607 measures a voltage from subcell 661 (the master subcell) and controls bias currents of subcell 661 and subcell 662 (the slave subcell). The gate of a switch 609 is tied to $V_{DD}$, so subcell 661 is always operational. The gate of a switch 629 is tied to a digital enable signal 639, which turns subcell 662 on ($E_2=V_{DD}$) or off ($E_2=V_{SS}$). Similarly, a transconductor cell can include a total of m+n subcells, with feedback from the m (master) subcells being used to generate the bias current for the m subcells and the n (slave) subcells.

FIG. 7 shows a transconductance cell 700 that includes two master subcells 761 and 762 (m=2) and one slave subcell 763 (n=1). Transconductance cell 700 includes switches 711 and 731. Switch 711 is always on (closed) because master subcell 761 is always active. Switch 731 is turned on (closed) when master subcell 762 is turned on (e.g., when the E2 signal is high).

FIG. 8 shows a process 800 for improving the linearity of a transconductance cell. The average of the source voltages of input transistors in the transconductance cell is measured (step 810), and the average voltage is regulated to equal a reference voltage (step 820). The average voltage can be regulated, for example, by controlling a voltage in the transconductance cell (e.g., at node 345 in FIG. 3) or a bias current of the transconductance cell.

In one implementation, bipolar junction transistors are used to construct transconductance cells (e.g., transconductance cells 100 and 300-700 in FIGS. 1 and 3-7). In another implementation, transistors (e.g., MOS devices) are used instead of one or more of the resistors in transconductance cells 100 and 300-700. In one implementation, the voltages at the source nodes of transistors in the transconductance cells (e.g., transistors 101 and 102 in transconductance cell 100 in FIG. 1) are averaged using a 3-input operational amplifier. Two input terminals of the operational amplifier are connected to the source terminals of the transistors, and the remaining input terminal is connected to the reference voltage. In another implementation, compensation capacitors (e.g., compensation capacitor 110) are not used in the feedback loop, and a gain of the operational amplifier in the feedback loop is instead reduced to improve the phase margin of the feedback loop.

The invention and all of the functional operations described in this specification can be implemented in digital electronic circuitry, or in computer hardware, firmware, software, or in combinations of them.

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

The invention has been described in terms of particular embodiments. Other embodiments are within the scope of the following claims, and the described apparatus and method can be used in many different types of digital or analog systems.

What is claimed is:

1. A transconductance cell comprising:

a first transistor including a first input terminal, a first output terminal, and a first bias terminal distinct from the first input terminal and the first output terminal;

a second transistor including a second input terminal, a second output terminal, and a second bias terminal distinct from the second input terminal and the second output terminal; and a regulator operable to regulate a first average voltage responsive to a reference voltage, the first average voltage corresponding to an average of a voltage at the first bias terminal and a voltage at the second bias terminal.

2. The transconductance cell of claim 1, further comprising:

a degeneration circuit operable to degenerate the first and second transistors.

3. The transconductance cell of claim 1, further comprising:

a voltage divider operable to measure the first average voltage and provide the measured first average voltage to the regulator, wherein the regulator is operable to regulate the first average voltage responsive to the reference voltage and the measured first average voltage.

4. The transconductance cell of claim 3, wherein:

the regulator includes an operational amplifier operable to receive the measured first average voltage and the reference voltage and to control a bias current through the first and second transistors, a bias voltage in the transconductance cell, or both.

5. The transconductance cell of claim 4, further comprising:

one or more capacitors operable to improve a phase margin of a feedback loop that includes the operational amplifier.

6. The transconductance cell of claim 1, wherein:

the first and second transistors are one of field effect transistors or bipolar junction transistors.

7. The transconductance cell of claim 1, wherein:

the regulator includes an operational amplifier operable to receive the voltage at the first bias terminal, the voltage at the second bias terminal, and the reference voltage and to control a bias current through the first and second transistors, a bias voltage in the transconductance cell, or both.

8. The transconductance cell of claim 1, wherein:

the transconductance cell includes a first subcell and a second subcell, the first subcell including the first and second transistors, the second subcell including a third transistor and a fourth transistor; and the regulator is operable to control a first bias current through the first and second transistors and a second bias current through the third and fourth transistors responsive to the reference voltage and a measurement of the first average voltage.

9. The transconductance cell of claim 1, wherein:

the transconductance cell includes a first subcell and a second subcell, the first subcell including the first and second transistors, the second subcell including a third transistor and a fourth transistor, the third transistor including a third bias terminal, the fourth transistor including a fourth bias terminal; and the regulator is operable to regulate the first average voltage and a second average voltage responsive to the reference voltage, a measurement of the first average voltage, and a measurement of the second average voltage, the second average voltage corresponding to the average of a voltage at the third bias terminal and a voltage at the fourth bias terminal.

10. A mixer comprising:

a transconductance cell operable to receive a differential input voltage and produce a differential output current, the transconductance cell including:

a first transistor including a first input terminal, a first output terminal, and a first bias terminal distinct from the first input terminal and the first output terminal, a second transistor including a second input terminal, a second output terminal, and a second bias terminal distinct from the second input terminal and the second output terminal, and a regulator operable to regulate an average voltage responsive to a reference voltage, the average voltage corresponding to the average of a voltage at the first bias terminal and a voltage at the second bias terminal; and one or more switches operable to multiply the differential output current with an oscillator signal.

11. The mixer of claim 10, wherein:

the transconductance cell includes a degeneration circuit operable to degenerate the first and second transistors.

12. The mixer of claim 10, wherein:

the transconductance cell includes a voltage divider operable to measure the first average voltage and provide the measured first average voltage to the regulator, wherein the regulator is operable to regulate the first average voltage responsive to the reference voltage and the measured first average voltage.

13. The mixer of claim 12, wherein:

the regulator includes an operational amplifier operable to receive the measured first average voltage and the reference voltage and to control a bias current through the first and second transistors, a bias voltage in the transconductance cell, or both.

14. The mixer of claim 13, wherein:

the transconductance cell includes one or more capacitors operable to improve a phase margin of a feedback loop that includes the operational amplifier.

15. The mixer of claim 10, wherein:

the first and second transistors are either field effect transistors or bipolar junction transistors.

16. The mixer of claim 10, wherein:

the regulator includes an operational amplifier operable to receive the voltage at the first bias terminal, the voltage at the second bias terminal, and the reference voltage and to control a bias current through the first and second transistors, a bias voltage in the transconductance cell, or both.

17. The mixer of claim 10, wherein:

the transconductance cell includes a first subcell and a second subcell, the first subcell including the first and second transistors, the second subcell including a third transistor and a fourth transistor; and the regulator is operable to control a first bias current through the first and second transistors and a second bias current through the third and fourth transistors responsive to the reference voltage and a measurement of the first average voltage.

18. The mixer of claim 10, wherein:

the transconductance cell includes a first subcell and a second subcell, the first subcell including the first and second transistors, the second subcell including a third transistor and a fourth transistor, the third transistor including a third bias terminal, the fourth transistor including a fourth bias terminal; and the regulator is operable to regulate the first average voltage and a second average voltage responsive to the reference voltage, a measurement of the first average voltage, and a measurement of the second average voltage, the second average voltage corresponding to the average of a voltage at the third bias terminal and a voltage at the fourth bias terminal.

19. A method comprising:

measuring an average voltage of a source voltage of a first transistor and a source voltage of a second transistor; and regulating the average voltage responsive to the measured average voltage and a reference voltage.

20. The method of claim 19, further comprising:

degenerating the first and second transistors.

21. The method of claim 19, wherein:

regulating the average voltage includes controlling a bias current through the first and second transistors, a bias voltage, or both.

22. The method of claim 19, wherein:

regulating the average voltage includes controlling a first bias current through the first and second transistors and a second bias current through a third transistor and a fourth transistor responsive to the measured average voltage and the reference voltage.

23. The method of claim 19, further comprising:

measuring a second average voltage of a voltage at a third bias terminal of a third transistor and a voltage at a fourth bias terminal of a fourth transistor, wherein regulating the average voltage includes regulating the average voltage and the second average voltage responsive to the measured average voltage, the reference voltage, and the second measured average voltage.

24. A transconductance cell comprising:

a first transistor having a gate coupled to a first input terminal, and a drain coupled to a first output terminal;

a second transistor having a gate coupled to a second input terminal, and a drain coupled to a second output terminal; and a regulator coupled to a source of first transistor and a source of second transistor, and operable to regulate an average of a voltage at the source of the first transistor and a voltage at the source of the second transistor responsive to a reference voltage.

25. The transconductance cell of claim 24, further comprising:

a degeneration circuit operable to degenerate the first and second transistors.

26. A transconductance cell comprising:

a first transistor having a gate coupled to a first input terminal, and a drain coupled to a first output terminal;

a second transistor having a gate coupled to a second input terminal, and a drain coupled to a second output terminal;

a voltage divider circuit coupled to a source of the first transistor and to a source of the second transistor, the voltage divider circuit operable to produce a first average voltage; and a regulator operable to regulate the first average voltage responsive to a reference voltage.

27. The transconductance cell of claim 26, wherein the regulator includes an operational amplifier operable to receive the first average voltage and the reference voltage, and control a bias current through the first transistor and the second transistor.

28. The transconductance cell of claim 27, further comprising:

a feedback loop including one or more capacitors and the operational amplifier, the one or more capacitors operable to improve a phase margin of the feedback loop.

29. The transconductance cell of claim 26, wherein:

the regulator includes an operational amplifier operable to receive the voltage at the source of the first transistor, the voltage at the source of the second transistor and the reference voltage, and to control a bias current through the first transistor and the second transistor.

30. The transconductance cell of claim 26, wherein:

the transconductance cell includes a first subcell and a second subcell, the first subcell including the first and second transistors, the second subcell including a third transistor and a fourth transistor; and the regulator is operable to control a first bias current through the first transistor and the second transistor and a second bias current through the third transistor and the fourth transistor responsive to the reference voltage and a measurement of the first average voltage.

* * * * *